(12) United States Patent
Cheng (10) Patent No.: US 11,587,594 B2
(45) Date of Patent: Feb. 21, 2023

(54) HEAT-DISSIPATING, SHOCK-ABSORBING STRUCTURE

(71) Applicant: Getac Technology Corporation, Hsinchu County (TW)

(72) Inventor: Hung-Chan Cheng, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 102 days.

(21) Appl. No.: 17/370,106

(22) Filed: Jul. 8, 2021

(65) Prior Publication Data

US 2021/0335392 A1 Oct. 28, 2021

Related U.S. Application Data

(62) Division of application No. 16/171,483, filed on Oct. 26, 2018, now Pat. No. 11,189,323.

(30) Foreign Application Priority Data

Jan. 17, 2018 (TW) .................................. 107101617

(51) Int. Cl.
| | |
|---|---|
| *G11B 33/08* | (2006.01) |
| *G11B 33/02* | (2006.01) |
| *G11B 33/14* | (2006.01) |
| *G11B 33/12* | (2006.01) |
| *H05K 5/04* | (2006.01) |
| *G11B 5/48* | (2006.01) |
| *H05K 13/00* | (2006.01) |

(52) U.S. Cl.
CPC ............ *G11B 33/08* (2013.01); *G11B 33/022* (2013.01); *G11B 33/124* (2013.01); *G11B 33/1406* (2013.01); *G11B 5/486* (2013.01); *G11B 5/4826* (2013.01); *H01L 2924/00* (2013.01); *H05K 5/04* (2013.01); *H05K 13/00* (2013.01)

(58) Field of Classification Search
CPC ..... G11B 33/08; G11B 33/022; G11B 33/124; G11B 33/1406; G11B 33/1284; G11B 5/486; G11B 5/4826; H01L 2924/00; H05K 13/00; H05K 5/04
USPC ......................................... 165/80.2
See application file for complete search history.

(56) References Cited

U.S. PATENT DOCUMENTS

| | | | | |
|---|---|---|---|---|
| 6,567,265 | B1 * | 5/2003 | Yamamura ............. | G11B 33/08 |
| 6,717,816 | B1 * | 4/2004 | Tanaka ................. | G11B 25/043 |
| | | | | 361/728 |
| 7,012,805 | B2 * | 3/2006 | Shah ...................... | G11B 33/08 |
| | | | | 361/679.36 |

(Continued)

*Primary Examiner* — Joel M Attey
(74) *Attorney, Agent, or Firm* — Locke Lord LLP; Tim Tingkang Xia, Esq.

(57) ABSTRACT

Provided is a heat-dissipating, shock-absorbing structure which is applicable to an electronic module with a hard disk drive. The heat-dissipating, shock-absorbing structure includes a heat-dissipating frame, an elastomer, and a plurality of heat conduction layers. The heat-dissipating frame has a fixing segment and two extending segments. The extending segments connect with two ends of the fixing segment. The fixing segment connects with one side of the hard disk drive. The distance between the extending segments is greater than the thickness of the hard disk drive. At least a portion of the elastomer is disposed at the extending segments. The heat conduction layers cover the elastomer.

5 Claims, 7 Drawing Sheets

(56) References Cited

U.S. PATENT DOCUMENTS

| | | | | |
|---|---|---|---|---|
| 10,372,168 | B1* | 8/2019 | He | G06F 1/20 |
| 2003/0206397 | A1* | 11/2003 | Allgeyer | G11B 33/08 |
| 2011/0139952 | A1* | 6/2011 | Chang | G06F 1/188 |
| | | | | 248/309.1 |
| 2017/0185117 | A1* | 6/2017 | Szeremeta | H05K 7/2039 |
| 2019/0107869 | A1* | 4/2019 | Hung | G11B 33/128 |

* cited by examiner

HEAT-DISSIPATING, SHOCK-ABSORBING STRUCTURE

CROSS-REFERENCE TO RELATED PATENT APPLICATION

This application is a divisional application of U.S. patent application Ser. No. 16/171,483, filed on Oct. 26, 2018, now pending, which itself claims priority to and the benefit of, pursuant to 35 U.S.C. § 119(a), patent application Serial No. TW107101617, filed in Taiwan on Jan. 17, 2018. The disclosure of each of the above applications is incorporated herein in its entirety by reference.

BACKGROUND OF THE INVENTION

Field of the Invention

The present invention relates to heat-dissipating, shock-absorbing structures and, more particularly, to a heat-dissipating, shock-absorbing structure applicable to a hard disk drive in an electronic device.

Description of the Prior Art

A hard disk drive of a conventional electronic device consists of components, such as disk platters, a read/write head, and driving motors. The aforesaid components are vulnerable as a result of a severe shake or compression happening to the hard disk drive while the hard disk drive is accessing data, thereby causing physical damage to the disk platters. To provide effective protection for the hard disk drive, a conventional protective structure essentially comprises a plurality of foam pads. The hard disk drive is entirely enclosed by the foam pads of the protective structure. The hard disk drive and the protective structure are jointly fixed in place inside an electronic device. The purpose of the foam pads enclosing the hard disk drive is to absorb shocks from the hard disk drive as soon as the electronic device in operation is lifted, placed on a desk, or inadvertently dropped, thereby protecting the aforesaid components of the hard disk drive against shocks.

However, the thermal conductivity of the foam pads is too low for heat generated from the hard disk drive in operation to dissipate. As a result, not only is the hard disk drive in operation likely to be overheated, but the function of a conventional protective structure is also restricted to protection for the hard disk drive. In view of the aforesaid drawbacks of the prior art, it is necessary to provide a novel heat-dissipating, shock-absorbing structure.

SUMMARY OF THE INVENTION

It is an objective of the present invention to provide a heat-dissipating, shock-absorbing structure which is applicable to an electronic module with a hard disk drive. The hard disk drive is mounted in place at a heat-dissipating frame of the heat-dissipating, shock-absorbing structure. An elastomer and a plurality of heat conduction layers are disposed at the heat-dissipating frame. The heat-dissipating frame and the heat conduction layers together effectively dissipate heat generated from the hard disk drive in operation. While the electronic device is shaking, the elastomer effectively absorbs shocks and thus protects the hard disk drive against shocks.

In order to achieve the above and other objectives, the present invention provides a heat-dissipating, shock-absorbing structure which is applicable to an electronic module with a hard disk drive. The heat-dissipating, shock-absorbing structure comprises a heat-dissipating frame, an elastomer, and a plurality of heat conduction layers. The heat-dissipating frame has a fixing segment and two extending segments. The extending segments connect with two ends of the fixing segment. The fixing segment connects with one side of the hard disk drive. The distance between the extending segments is greater than the thickness of the hard disk drive. At least a portion of the elastomer is disposed at the extending segments. The heat conduction layers cover the elastomer.

The extending segments extend to an upper surface and a lower surface of the hard disk drive, respectively, to form a gap between the upper surface and the lower surface.

The upper surface and the lower surface each define two lateral zones and a central zone between the lateral zones, and the extending segments extend to the lateral zones, respectively, such that the gap is formed between the extending segments and the lateral zones.

In an embodiment of the present invention, the elastomer is provided in plurality, with the elastomers attached to the extending segments, respectively, allowing the heat conduction layers to enclose the elastomers and the heat-dissipating frame.

In another embodiment of the present invention, the elastomer is provided in plurality, with the heat conduction layers enclosing the elastomers, respectively, such that the heat conduction layers and the elastomers are disposed at the extending segments, allowing the heat conduction layers to be partially disposed between the elastomers and the heat-dissipating frame, respectively.

In another embodiment of the present invention, one of the extending segments has a hollowed-out or cantilever structure.

The electronic module further has a casing for receiving the hard disk drive and the heat-dissipating, shock-absorbing structure.

In an embodiment of the present invention, one of the extending segments extends outward.

BRIEF DESCRIPTION OF THE DRAWINGS

Objectives, features, and advantages of the present invention are hereunder illustrated with preferred embodiments in conjunction with the accompanying drawings, in which.

DETAILED DESCRIPTION OF THE EMBODIMENTS

Figure 1:
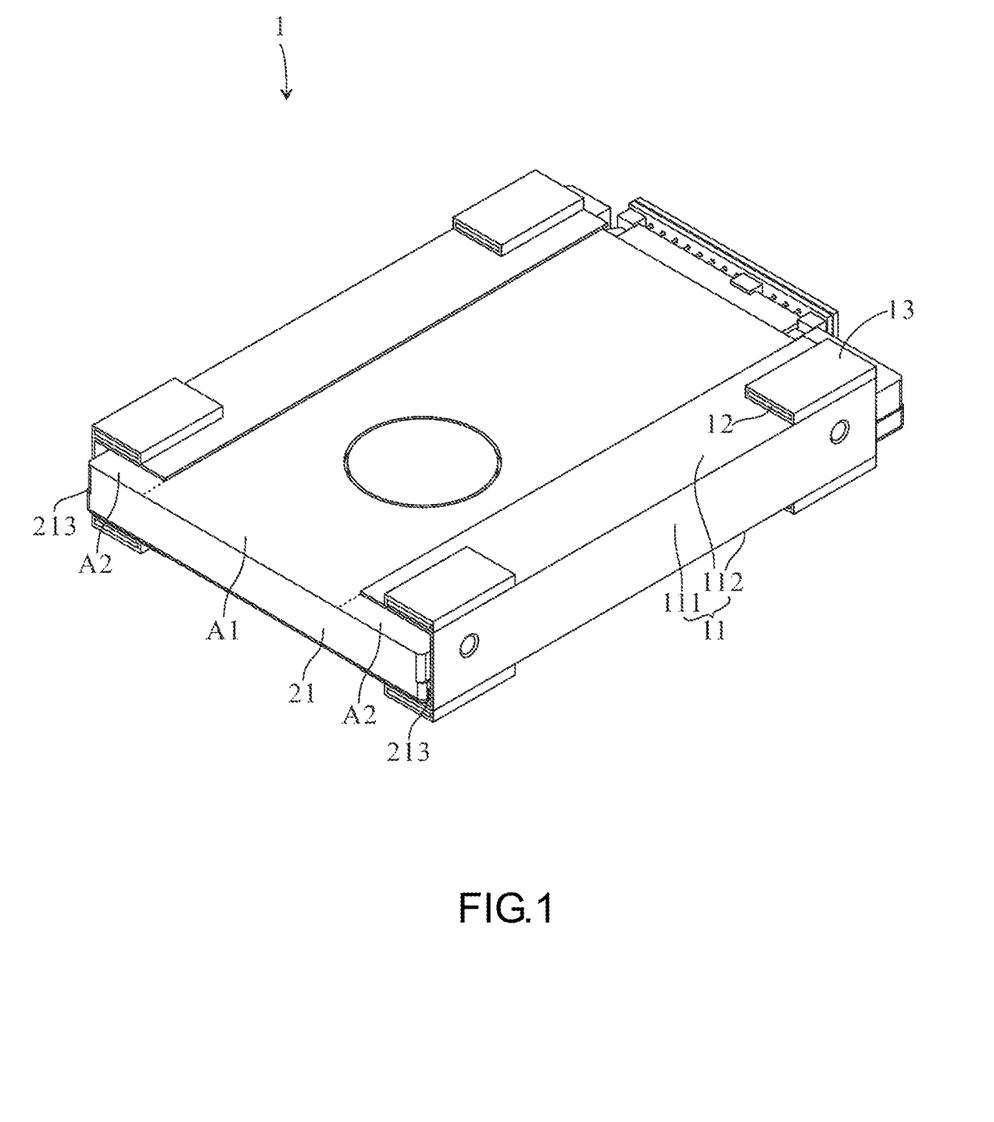
FIG. 1 is a perspective schematic view of how a heat-dissipating, shock-absorbing structure in the first embodiment of the present invention is coupled to a hard disk drive.
Figure 2:
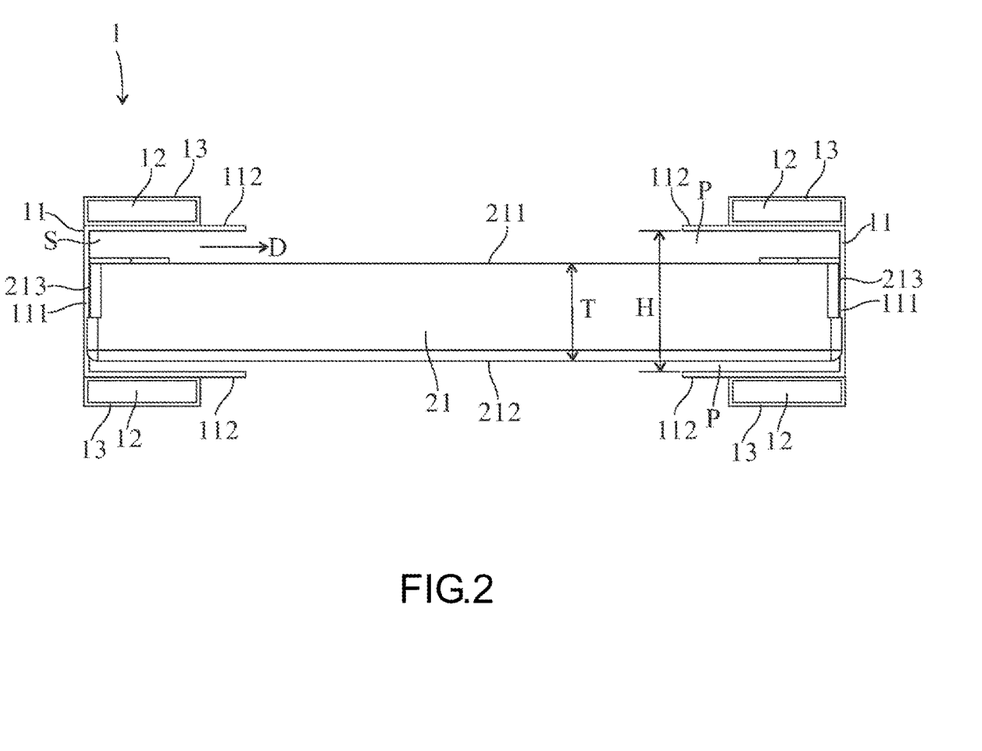
FIG. 2 is a lateral schematic view of how the heat-dissipating, shock-absorbing structure in the first embodiment of the present invention is coupled to the hard disk drive.

The present invention provides a heat-dissipating, shock-absorbing structure 1 which is applicable to an electronic module. FIG. 1 and FIG. 2 are schematic views of how the heat-dissipating, shock-absorbing structure 1 in the first embodiment of the present invention is coupled to a hard disk drive 21 of an electronic module (not shown). In the first embodiment, the heat-dissipating, shock-absorbing structure 1 comprises two heat-dissipating frames 11, a plurality of elastomers 12, and a plurality of heat conduction layers 13. The description below explains how components of the heat-dissipating, shock-absorbing structure 1 relate to an electronic module.

The heat-dissipating frames 11 are disposed on two opposing sides 213 of the hard disk drive 21, respectively. Since both the heat-dissipating frames 11 connect with the hard disk drive 21 in the same way, the first embodiment illustrates how one of the heat-dissipating frames 11 connects with the hard disk drive 21 for the sake of brevity. The heat-dissipating frame 11 has a fixing segment 111 and two extending segments 112. The fixing segment 111 is connected between the extending segments 112 such that the heat-dissipating frame 11 is U-shaped. The fixing segment 111 and the extending segments 112 jointly define a receiving space S such that the hard disk drive 21 is partially received in the receiving space S. The fixing segment 111 and the extending segments 112 jointly define an opening. The opening opens in an opening direction D to face the hard disk drive 21. The fixing segment 111 connects with the sides 213 of the hard disk drive 21. The extending segments 112 extend to an upper surface 211 and a lower surface 212 of the hard disk drive 21, respectively. A distance H between the extending segments 112 is greater than a thickness T of the hard disk drive 21. Therefore, as shown in FIG. 2, the extending segments 112 extend to the upper surface 211 and the lower surface 212 of the hard disk drive 21, respectively, such that a gap P is formed between the upper surface 211 and the lower surface 212. The upper surface 211 and the lower surface 212 each define two lateral zones A2 and a central zone A1 between the lateral zones A2; hence, the extending segments 112 extend to the lateral zones A2, respectively, such that the gap P is formed between the extending segments 112 and the lateral zones A2.

Figure 3:
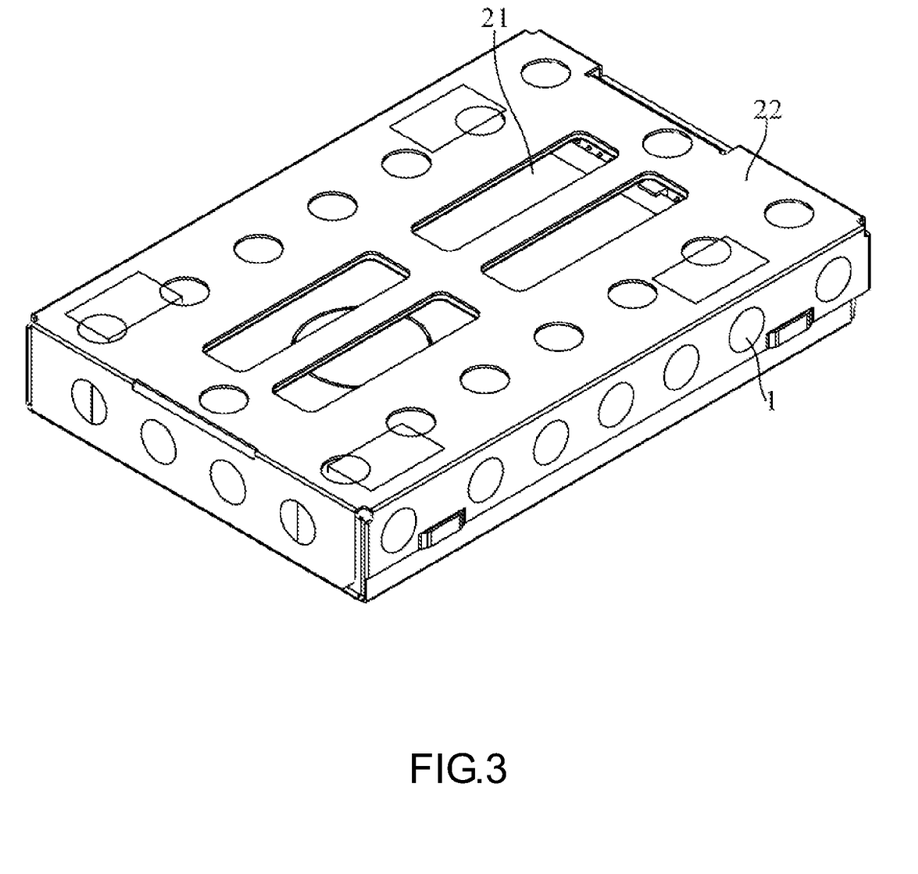
FIG. 3 is a perspective schematic view of how the heat-dissipating, shock-absorbing structure in the first embodiment of the present invention is coupled to an electronic device.

Referring to FIG. 2, the heat conduction layers 13 enclose the elastomers 12, respectively, such that the heat conduction layers 13 and the elastomers 12 are disposed at the extending segments 112. Therefore, the heat conduction layers 13 are partially disposed between the heat-dissipating frame 11 and the elastomers 12, respectively. Referring to FIG. 3, after the heat-dissipating, shock-absorbing structure 1 and the hard disk drive 21 have been put together, they are placed in a casing 22 of an electronic module. Then, the casing 22 is placed in an internal space of the electronic device. Therefore, heat generated from the hard disk drive 21 is transferred from the sides 213 of the hard disk drive 21 to the fixing segment 111 and the extending segments 112, even proceeds to the heat conduction layers 13, and is finally dissipated through the casing 22. Therefore, enclosure by the heat conduction layers 13 solves the problem with the low thermal conductivity of the elastomers 12. In addition, with the hard disk drive 21 being suspended in the air within the heat-dissipating frames 11, the hard disk drive 21 is never subjected to compression which might otherwise cause damage to its components, such as disk platters, a read/write head, and driving motors. Furthermore, the elastomers 12 disposed at the extending segments 112 absorb shocks and thus protect the hard disk drive 21 against shocks.

Figure 4:
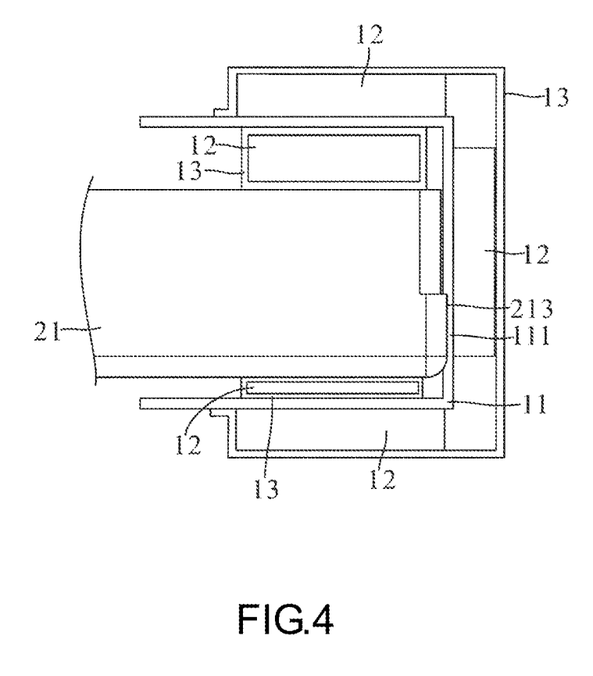
FIG. 4 is a lateral schematic view of how the heat-dissipating, shock-absorbing structure in the second embodiment of the present invention is coupled to the hard disk drive.

It is worth noting that the arrangement and quantity of the heat-dissipating frames 11, the elastomers 12, and the heat conduction layers 13 are subject to changes as need. For instance, as shown in FIG. 4, which is a lateral schematic view of how the heat-dissipating, shock-absorbing structure in the second embodiment of the present invention is coupled to the hard disk drive 21, the elastomers 12 are directly disposed at the heat-dissipating frames 11 and in direct contact with the heat-dissipating frames 11 (that is, the elastomers 12 and the hard disk drive 21 are on opposite sides of the heat-dissipating frames 11). In a variant embodiment, the heat conduction layers 13 are provided in the number of one to enclose the elastomers 12 and the heat-dissipating frames 11 concurrently, whereas the heat-dissipating frames 11 or the elastomers 12 are also provided in the number of one as needed. The elastomers 12 may not only be disposed outside the extending segments 112 but may also be disposed at the fixing segment 111 to protect the sides 213 of the hard disk drive 21 concurrently. As shown in FIG. 4, after being enclosed by the heat conduction layers 13, the elastomers 12 are disposed between the extending segments 112 and the upper surface 211 or the lower surface 212 of the hard disk drive 21 (that is, after being enclosed by the heat conduction layers 13, the elastomers 12 are disposed on the same side of the heat-dissipating frames 11 as the hard disk drive 21 is.)

In this embodiment, the heat-dissipating frames 11, the heat conduction layers 13 and the casing 22 are made of metal, whereas the elastomers 12 are made of foam, but the present invention is not limited thereto. At the very least, the elastomers 12 have a greater elastic modulus than the heat conduction layers 13, whereas the heat conduction layers 13 have a greater coefficient of heat conductivity than the elastomers 12, so as to effectuate heat dissipation and shock absorption anticipated according to the present invention.

Figure 5:
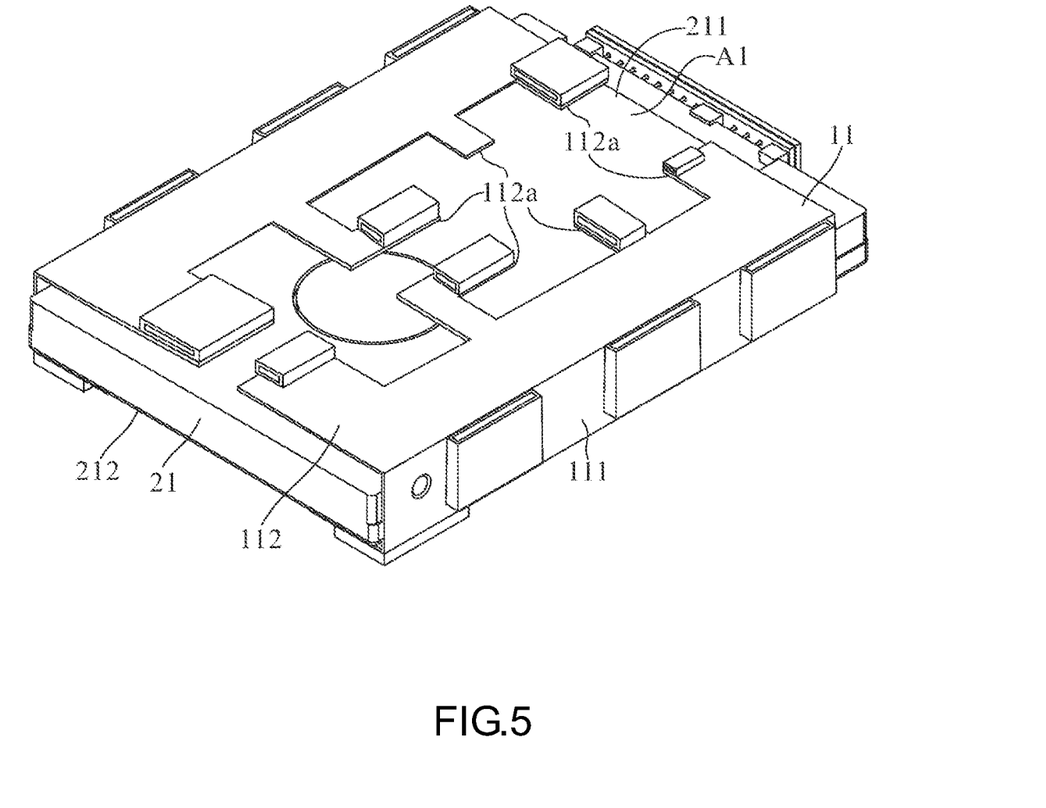
FIG. 5 is a perspective schematic view of how the heat-dissipating, shock-absorbing structure in the third embodiment of the present invention is coupled to the hard disk drive.

FIG. 5 is a perspective schematic view of how the heat-dissipating, shock-absorbing structure in the third embodiment of the present invention is coupled to the hard disk drive 21. This embodiment is distinguished from the preceding embodiments by technical features as follows: in this embodiment, the extending segments 112 each have a cantilever structure 112a extending to above the central zone A1 of the upper surface 211 and the lower surface 212; the cantilever structure 112a is separated from the upper surface 211 and the lower surface 212 by a distance to increase the heat transfer area of the heat-dissipating frames 11; the elastomers 12 are disposed at the extending segments 112, the cantilever structure 112a and the fixing segment 111; and, after being enclosed by the heat conduction layers 13, the elastomers 12 are disposed at the heat-dissipating frames 11. In a variant embodiment, the elastomers 12 are directly disposed at the heat-dissipating frames 11, and then the heat conduction layers 13 enclose the elastomers 12 and the heat-dissipating frames 11.

Figure 6:
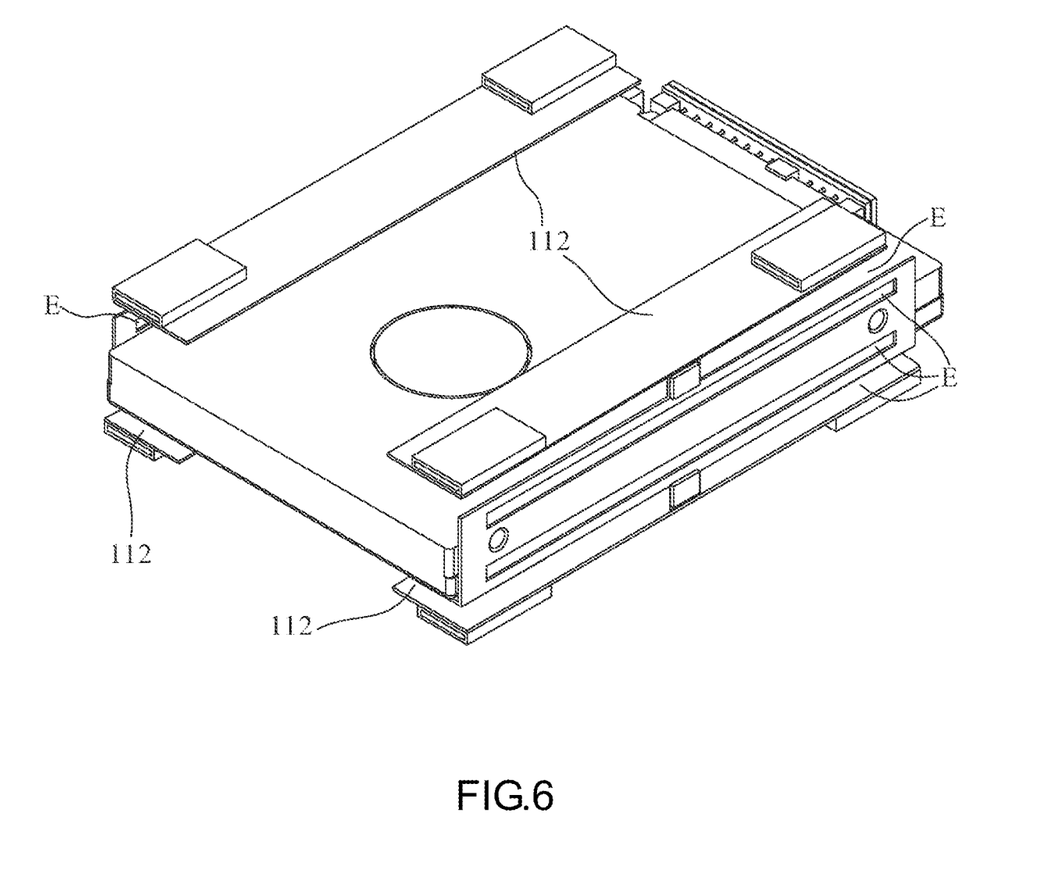
FIG. 6 is a perspective schematic view of how the heat-dissipating, shock-absorbing structure in the fourth embodiment of the present invention is coupled to the hard disk drive.

FIG. 6 is a perspective schematic view of how the heat-dissipating, shock-absorbing structure in the fourth embodiment of the present invention is coupled to the hard disk drive 21. This embodiment is substantially identical to the first embodiment in structure. This embodiment is distinguished from the preceding embodiments by technical features as follows: in this embodiment, the extending segments 112 and the fixing segment 111 each have a plurality of hollowed-out regions E, respectively. Therefore, this embodiment features the hollowed-out regions E but dispenses with unimportant heat transfer blocks, so as to reduce the weight of the heat-dissipating frames 11 while effectuating heat transfer.

Figure 7:
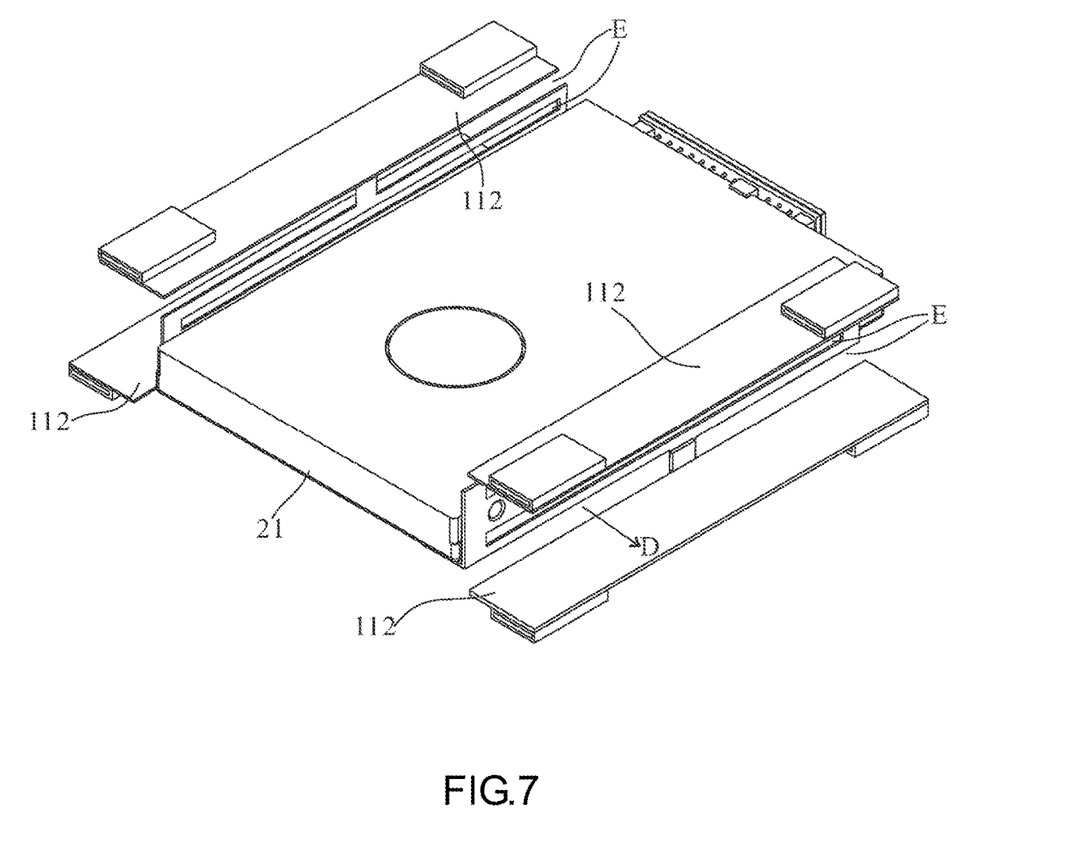
FIG. 7 is a perspective schematic view of how the heat-dissipating, shock-absorbing structure in the fifth embodiment of the present invention is coupled to the hard disk drive.

FIG. 7 is a perspective schematic view of how the heat-dissipating, shock-absorbing structure in the fifth embodiment of the present invention is coupled to the hard disk drive 21. Like the fourth embodiment, the fifth embodiment is characterized in that the extending segments 112 and the fixing segment 111 each have the hollowed-out regions E. This embodiment is distinguished from the preceding embodiments by technical features as follows: in this embodiment, after the fixing segment 111 has connected with the sides 213 of the hard disk drive 21, the extending segments 112 extend outward away from the hard disk drive 21; the extending segments 112 are absent from above and below the upper surface 211 and the lower surface 212 of the hard disk drive 21; hence, the fixing segment 111 and the extending segments 112 jointly define an opening, and an opening direction D of the opening points away from the hard disk drive 21.

In conclusion, a heat-dissipating, shock-absorbing structure of the present invention comprises: a heat-dissipating frame in which a hard disk drive is suspended in the air, to not only allow the heat-dissipating frame to dissipate heat generated from the hard disk drive in operation, but also provide first-tier protection for the hard disk drive which might otherwise be vulnerable to compression; elastomers for absorbing shocks to provide second-tier protection for the hard disk drive; and heat conduction layers for assisting in dissipating heat generated from the hard disk drive. Therefore, the heat-dissipating, shock-absorbing structure of the present invention achieves heat dissipation and shock absorption concurrently.

The implementation and technical features of the present invention are illustrated above by preferred embodiments. However, the preferred embodiments are not restrictive of the scope of the present invention. Hence, all changes and equivalent arrangements easily made to the aforesaid embodiments by persons skilled in the art shall fall within the scope of the present invention. Accordingly, the legal protection for the present invention shall be defined by the appended claims.

What is claimed is:

1. A heat-dissipating, shock-absorbing structure, configured to be applied to an electronic module with a hard disk drive, the heat-dissipating, shock-absorbing structure comprising:
   a heat-dissipating frame having a fixing segment and two extending segments, wherein each of two ends of the fixing segment is connected to a corresponding one of the two extending segments, the fixing segment is connected with a side of the hard disk drive, and a distance between the extending segments greater than a thickness of the hard disk drive;
   a plurality of elastomers; and
   a plurality of heat conduction layers correspondingly covering the elastomers, wherein each of the elastomers is covered by a corresponding one of the heat conduction layers, such that each of the elastomers and the corresponding one of the heat conduction layers are disposed at a corresponding one of the extending segments or the fixing segment, and at least one of the elastomers and the corresponding one of the heat conduction layers are disposed at the fixing segment.

2. The heat-dissipating, shock-absorbing structure of claim 1, wherein the extending segments correspondingly extend along an upper surface and a lower surface of the hard disk drive, respectively, to form a first gap between the upper surface and one of the extending segments, and a second gap between the lower surface and the other of the extending segments.

3. The heat-dissipating, shock-absorbing structure of claim 2, wherein each of the upper surface and the lower surface defines two lateral zones and a central zone between the lateral zones, and the extending segments extend along the lateral zones, respectively, such that the first gap is formed between the one of the extending segments and a corresponding one of the lateral zones of the upper surface, and the second gap is formed between the other of the extending segments and a corresponding one of the lateral zones of the lower surface.

4. An electronic module, comprising:
   a hard disk drive; and
   the heat-dissipating, shock-absorbing structure of claim 1.

5. The electronic module of claim 4, further comprising a casing receiving the hard disk drive and the heat-dissipating, shock-absorbing structure.

\* \* \* \* \*